(12) United States Patent
Do

(10) Patent No.: US 8,274,770 B2
(45) Date of Patent: Sep. 25, 2012

(54) ELECTROSTATIC DISCHARGE PROTECTION OF SEMICONDUCTOR DEVICE

(75) Inventor: Chang-Ho Do, Gyeonggi-do (KR)

(73) Assignee: Hynix Semiconductor Inc., Gyeonggi-do (KR)

( * ) Notice: Subject to any disclaimer, the term of this patent is extended or adjusted under 35 U.S.C. 154(b) by 940 days.

(21) Appl. No.: 12/347,503

(22) Filed: Dec. 31, 2008

(65) Prior Publication Data

US 2010/0008001 A1 Jan. 14, 2010

(30) Foreign Application Priority Data

Jul. 9, 2008 (KR) ........................ 10-2008-0066595

(51) Int. Cl.
*H02H 9/00* (2006.01)
(52) U.S. Cl. ........................................ 361/56
(58) Field of Classification Search ............ 361/56
See application file for complete search history.

(56) References Cited

U.S. PATENT DOCUMENTS

| | | | | |
|---|---|---|---|---|
| 6,369,427 B1 * | 4/2002 | Williamson | .................. | 257/355 |
| 6,947,268 B2 * | 9/2005 | Hisaka | ............... | 361/56 |
| 7,248,450 B1 * | 7/2007 | Dempsey | .......... | 361/10 |
| 7,795,102 B1 * | 9/2010 | Vashchenko et al. | .......... | 438/309 |
| 7,812,674 B2 * | 10/2010 | Karp | .............. | 330/298 |
| 2001/0024348 A1 * | 9/2001 | May et al. | ........... | 361/56 |
| 2002/0027755 A1 * | 3/2002 | Andresen et al. | ............ | 361/56 |
| 2003/0067726 A1 * | 4/2003 | Voldman | ............ | 361/91.2 |
| 2004/0094779 A1 * | 5/2004 | Isezaki et al. | .......... | 257/202 |
| 2005/0128665 A1 * | 6/2005 | Roohparvar | .......... | 361/56 |
| 2008/0094767 A1 * | 4/2008 | Watanabe | .......... | 361/56 |
| 2008/0165459 A1 * | 7/2008 | Holly et al. | .......... | 361/56 |
| 2008/0290493 A1 * | 11/2008 | Tsunozaki | .......... | 257/686 |
| 2009/0097176 A1 * | 4/2009 | Watanabe | .......... | 361/56 |
| 2009/0207539 A1 * | 8/2009 | Suzuki | .......... | 361/56 |
| 2009/0219658 A1 * | 9/2009 | Jin | .......... | 361/56 |
| 2009/0316456 A1 * | 12/2009 | Wu | .......... | 363/127 |
| 2010/0165523 A1 * | 7/2010 | Son | .......... | 361/56 |
| 2010/0315748 A1 * | 12/2010 | Kwong et al. | .......... | 361/56 |

FOREIGN PATENT DOCUMENTS

KR 1020020002609 A 1/2002
KR 1020050062249 A 6/2005

OTHER PUBLICATIONS

Notice of Allowance issued from Korean Intellectual Property Office on Sep. 23, 2009.

* cited by examiner

*Primary Examiner* — Ronald W Leja
(74) *Attorney, Agent, or Firm* — IP & T Group LLP

(57) ABSTRACT

A semiconductor device includes a pads for receiving a reference voltage and input signals from an external device, a unit gain buffer for receiving the reference voltage as an input, input buffers for identifying a corresponding one of the input signals based on an internal reference voltage outputted from the unit gain buffer, external electrostatic discharge protectors connected to a transmission path of the reference voltage and transmission paths of input signals, and internal electrostatic discharge protectors connected to the transmission path of the reference voltage and the transmission paths of the input signals.

14 Claims, 7 Drawing Sheets

US 8,274,770 B2

ELECTROSTATIC DISCHARGE PROTECTION OF SEMICONDUCTOR DEVICE

CROSS-REFERENCE TO RELATED APPLICATIONS

The present invention claims priority of Korean patent application number 10-2008-0066595, filed on Jul. 9, 2008, which is incorporated by reference in its entirety.

BACKGROUND OF THE INVENTION

The present invention relates to a semiconductor design technology, and more particularly, to a technology for forming an electrostatic discharge protection circuit of a semiconductor device.

A gate oxide layer of a metal oxide semiconductor (MOS) element, among the internal circuits of a semiconductor device, has a problem of easily being destroyed by electrostatic discharge (ESD), because of high input impedance of a gate. Since the thickness of the gate oxide layer of a transistor in an internal circuit is reduced to manufacture a high performance and highly integrated semiconductor device, it is necessary to dispose an electrostatic discharge protection circuit in a semiconductor device for protecting an internal circuit thereof from the electrostatic discharge.

An electrostatic discharge standard model is used for evaluating durability and performance of an electrostatic discharge protection circuit and for analyzing the effect of electrostatic discharge on an internal circuit. In general, three electrostatic discharge standard models have been introduced. They are described hereinafter.

The first general electrostatic discharge standard model is a human body model (HBM). The HBM is a model for simulating the discharge that might occur when a human touches a semiconductor device. The second general electrostatic discharge standard model is a machine model (MM). The MM is a model for simulating the discharge when a metallic machine touches a semiconductor device in a semiconductor device manufacturing process. The third general electrostatic discharge standard model is a charged device model (CDM). The CDM is a model for discharging electrostatic charge in a semiconductor device to an external ground or an external conductor in a semiconductor memory fabricating process such as a package assembly process.

The electrostatic discharge protection circuit is manufactured with a grounded gate MOSFET (ggMOS), a gate-coupled MOSFET (gcMOS), a bipolar junction transistor (BJT), a diode, or other metal-oxide-semiconductor elements, which makes excess current flow to a power source by clamping a constant voltage using a parasitic bipolar junction transistor (BJT) that is internally generated when electrostatic discharge is generated. Since the electrostatic discharge protection circuit may make supplementary influence such as leakage current as a kind of parasitic capacitance component when the electrostatic discharge dose not occur, the size and the number of the electrostatic discharge protection circuits should be properly controlled.

Since the semiconductor device determines the logical level of an input signal, for example, an ADDRESS signal, a COMMAND signal, or a DATA signal, based on a reference voltage, the semiconductor device includes a plurality of input buffers for detecting each of the input signals. An input buffer for detecting a logical level of an input signal based on a reference voltage is defined as a pseudo differential type buffer and is internally formed as a differential amplification circuit that receives an input signal and a reference voltage.

FIG. 1 is a diagram illustrating a semiconductor device according to the related art.

Referring to FIG. 1, the semiconductor device includes: a plurality of pads for receiving a reference voltage VREF and a plurality of input signals IN1 to INi; a plurality of input buffers 121A to 121I for receiving the reference voltage VREF and a corresponding input signal; a plurality of external electrostatic discharge protectors 101A to 101I, and an external electrostatic discharge protector 102 connected to the transmission path of a reference voltage VREF and a corresponding input signal for protecting the plurality of input buffers 121A to 121I from the external electrostatic discharge; and a plurality of internal electrostatic discharge protectors 111A to 111I and 112A to 112I connected to the transmission path of the reference voltage VREF and a corresponding input signal for protecting the plurality of input buffers 121 to 121I from internal electrostatic discharge.

The external electrostatic discharge protectors 101A to 101I and 102 are disposed adjacent to the pad because they are electrostatic discharge protection circuits corresponding to the HBM and the MM. The internal electrostatic discharge protectors 111A to 111I and 112A to 112I are disposed adjacent to an input buffer because they are electrostatic discharge protection circuits corresponding to the CDM. Therefore, one external electrostatic discharge protector and a plurality of internal electrostatic discharge protectors as many as the number of input buffers are disposed at (connected to) the transmission path of the reference voltage VREF while one external electrostatic discharge protector and one internal electrostatic discharge protector are disposed at (connected to) the transmission path of each input signal.

Therefore, greater parasitic capacitance component may be generated and the current may be badly leaked at the transmission path of the reference voltage compared with the transmission path of the input signal. If even one of the internal electrostatic discharge protectors is defected, the reference voltage VREF may be internally distorted.

The input buffer of the semiconductor device according to the related art will be described hereinafter.

FIG. 2 is a circuit diagram illustrating the input buffer of FIG. 1.

Referring to FIG. 2, the input buffer includes a current mirroring unit 210 connected between a power source voltage end VDD and both a first connection end N1 and an output end N0, a first input transistor MN1 connected between the first connection end N1 and a second connection end N2 and controlled based on a reference voltage VREF, a second input transistor MN2 connected between the output end N0 and the second connection end N2 and connected by an input signal INi, and a bias transistor MN3 connected between the second connection end N2 and a ground voltage end VSS controlled by an enable signal EN.

The input buffer further includes an inverter INV1 for inverting a signal outputted from the output end N0, a first transistor MP1 connected between the power source voltage end VDD and the first connection end N1 and controlled by the enable signal EN, and a second transistor MP4 connected between the power source voltage end VDD and the output end N0 and controlled by the enable signal EN.

In the input buffer, the first input transistor MN1 is an NMOS transistor that receives the reference voltage VREF as the input of the gate, and the second transistor MN2 is an NMOS transistor that receives the input signal INi as the input of the gate. Therefore, the first and second input transistors MN1 and MN2 may be electrostatic discharge sensitive elements, and the external and internal electrostatic discharge protectors protect the first and second input transistors MN1 and MN2.

As described above, the semiconductor device according to the related art includes a plurality of input buffers for detecting each of input signals INi based on the reference voltage VREF and a plurality of internal electrostatic discharge protectors at the transmission path of the reference voltage VREF for protecting electrostatic sensitive elements from the electrostatic discharge. Therefore, the size of the semiconductor device according to the related art increases. The semiconductor device according to the related art has greater parasitic capacitance and bad current leakage compared to other input signals. Therefore, the semiconductor device according to the related art may include defects.

SUMMARY OF THE INVENTION

Embodiments of the present invention are directed to providing a semiconductor device including a reduced number of electrostatic discharge sensitive elements that are free from electrostatic discharge by internally using an internal reference voltage outputted from a unit gain buffer or an internal reference voltage generator.

In accordance with an aspect of the present invention, there is provided a semiconductor device including: a plurality of pads for receiving a reference voltage and a plurality of input signals from an external device; a unit gain buffer for receiving the reference voltage as an input; a plurality of input buffers, each identifying a corresponding one of the plurality of input signals based on an internal reference voltage outputted from the unit gain buffer; a plurality of external electrostatic discharge protectors connected at (connected to) transmission path of the reference voltage and transmission paths of a plurality of input signals; and a plurality of internal electrostatic discharge protectors connected at (connected to) the transmission path of the reference voltage and the transmission paths of the plurality of input signals.

In accordance with another aspect of the present invention, there is provided a semiconductor device including: a plurality of pads for receiving a reference voltage and a plurality of input signals from an external device; an internal reference voltage generator for generating an internal reference voltage by shifting an electric potential level of the reference voltage; a plurality of input buffers, each identifying a corresponding one of the plurality of input signals based on the internal reference voltage; a plurality of external electrostatic discharge protectors connected to transmission path of the reference voltage and transmission paths of the plurality of input signals; and a plurality of internal electrostatic discharge protectors connected to the transmission path of the reference voltage and the transmission paths of the plurality of input signals.

A semiconductor device according to the present invention includes a unit gain buffer for transferring a reference voltage from an external device to a plurality of input buffers or an internal reference voltage generator for generating an internal reference voltage using a reference voltage. The semiconductor device according to the present invention further includes an internal electrostatic discharge protector for preventing electrostatic discharge sensitive elements of the unit gain buffer or the internal reference voltage generator. Therefore, the number of internal electrostatic discharge protector is reduced because input ends of an internal circuit, which uses an internal reference voltage outputted from the unit gain buffer or the internal reference voltage generator, are not an electrostatic discharge sensitive element.

DESCRIPTION OF SPECIFIC EMBODIMENTS

Other objects and advantages of the present invention can be understood by the following description, and become apparent with reference to the embodiments of the present invention.

In general, a logical signal of a circuit is divided into a high level (H) or a low level (L) corresponding to a voltage level and expressed as '1' and '0', respectively. Also, the logical signal of the circuit may be additionally defined and described as having a high impendence state (HI-Z) as occasion demands. In the present embodiments, a P-channel metal oxide semiconductor (PMOS) and an N-channel metal oxide semiconductor (NMOS) are metal oxide semiconductor field effect transistors (MOSFET) that can be used.

Figure 1:
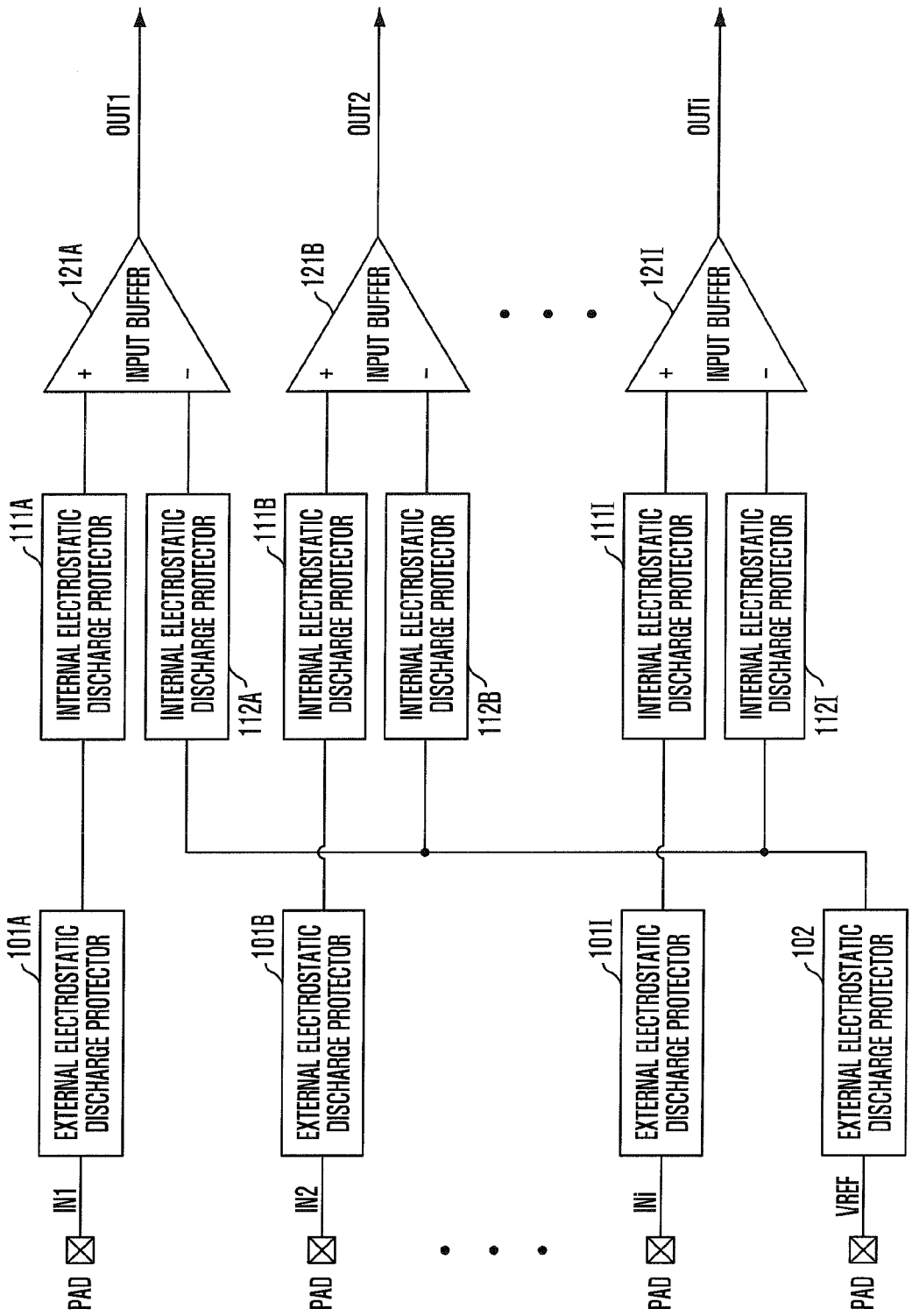
FIG. 1 is a diagram illustrating a semiconductor device according to the related art.
Figure 2:
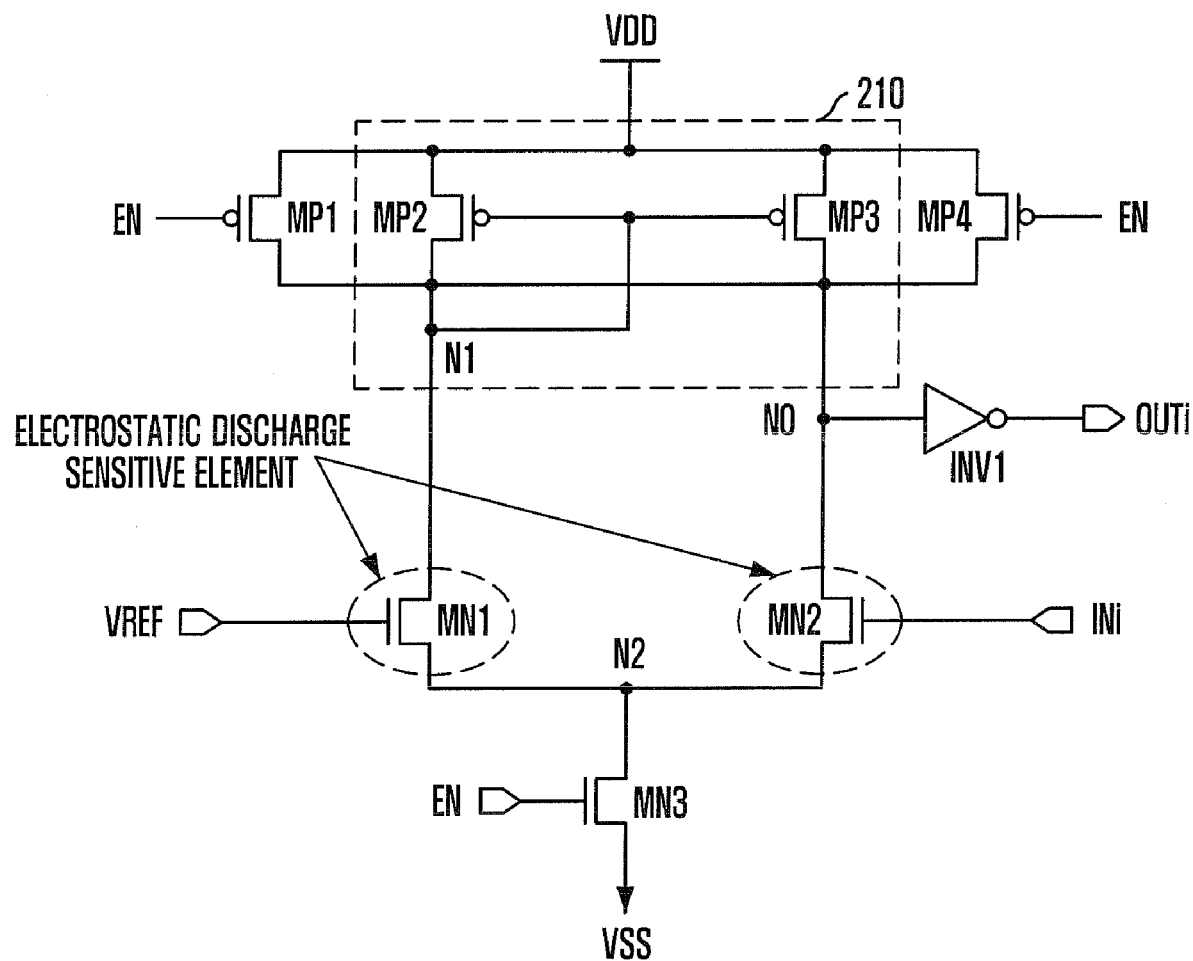
FIG. 2 is a circuit diagram illustrating an input buffer of FIG. 1.
Figure 3:
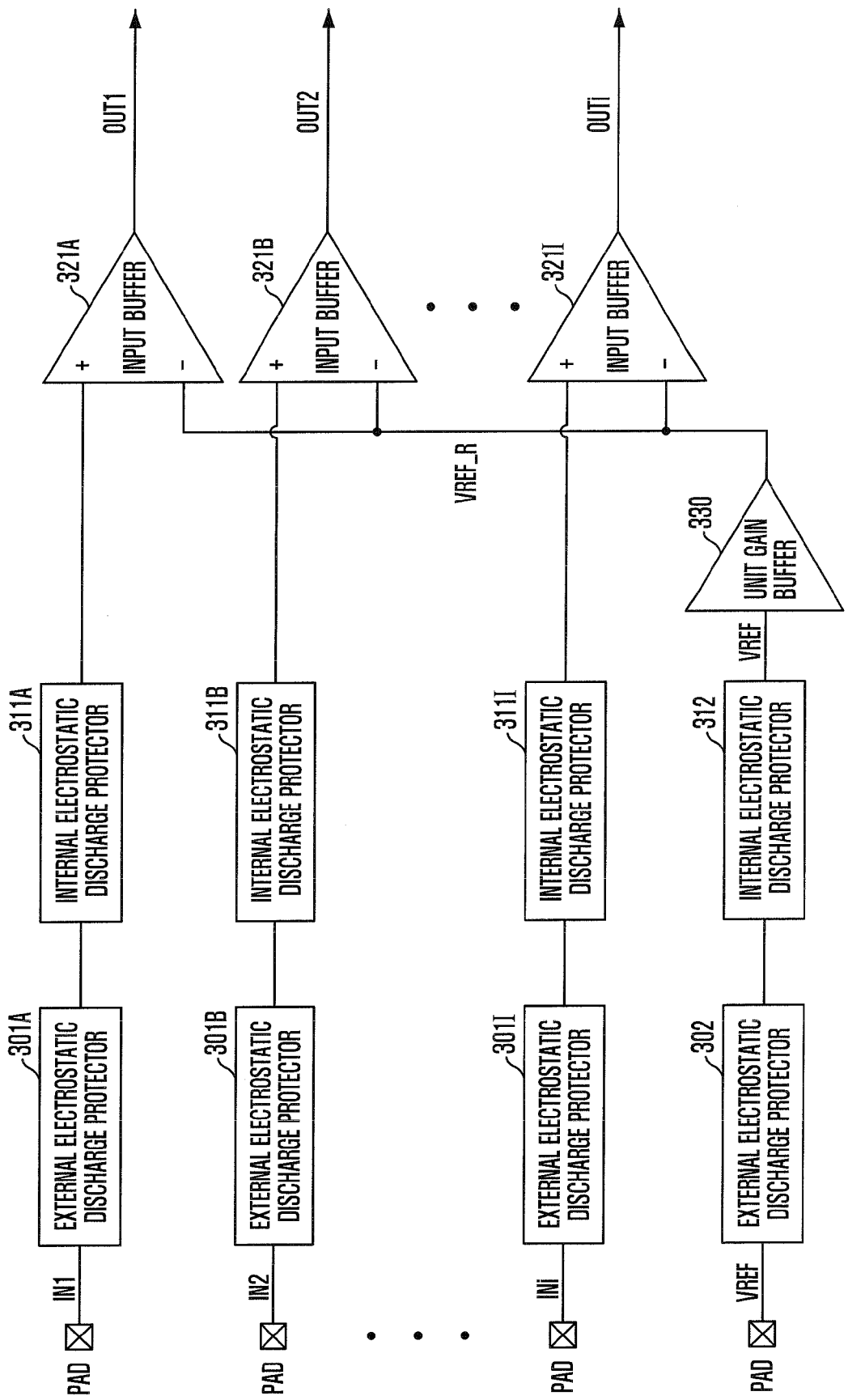
FIG. 3 is a diagram illustrating a semiconductor device in accordance with an embodiment of the present invention.

FIG. 3 is a diagram illustrating a semiconductor device in accordance with an embodiment of the present invention.

Referring to FIG. 3, the semiconductor device according to the present embodiment includes a plurality of pads (PAD) for receiving a reference voltage VREF and a plurality of input signals IN1 to INi from an external device, a unit gain buffer 330 for receiving the reference voltage VREF as an input, a plurality of input buffers 321A to 321I for identifying a corresponding input signal based on an internal reference voltage VREF_R outputted from the unit gain buffer 330, a plurality of external electrostatic discharge protectors 301A to 301I and 302 connected to the transmission path of the reference voltage and the transmission paths of a plurality of input signals, and a plurality of internal electrostatic discharge protectors 311A to 311I and 312 connected to the transmission path of the reference voltage and the transmission paths of the plurality of input signals.

The external electrostatic discharge protectors 301A to 301I and 302 are disposed adjacent to the pads because the external electrostatic discharge protectors are electrostatic discharge protection circuits corresponding to the HBM and the MM. The internal electrostatic discharge protectors 311A to 311I and 312 are disposed adjacent to the unit gain buffer 330 and the input buffers 321A to 321I because the internal electrostatic discharge protectors are electrostatic discharge protection circuits corresponding to the CDM. Therefore, one external electrostatic discharge protector and one internal electrostatic discharge protector are disposed at (connected to) the transmission path of each input signal. Also, one external electrostatic discharge protector and one internal electrostatic discharge protector are disposed at (connected to) the transmission path of the reference voltage VREF. The unit gain buffer 330 is a unit amplification circuit ideally having a gain of 1. The unit gain buffer 330 generates an internal reference voltage VREF_R having an electric potential identical to that of the reference voltage VREF applied from the outside and applies the generated internal reference voltage to each of the input buffers 321A to 321I.

Figure 4:
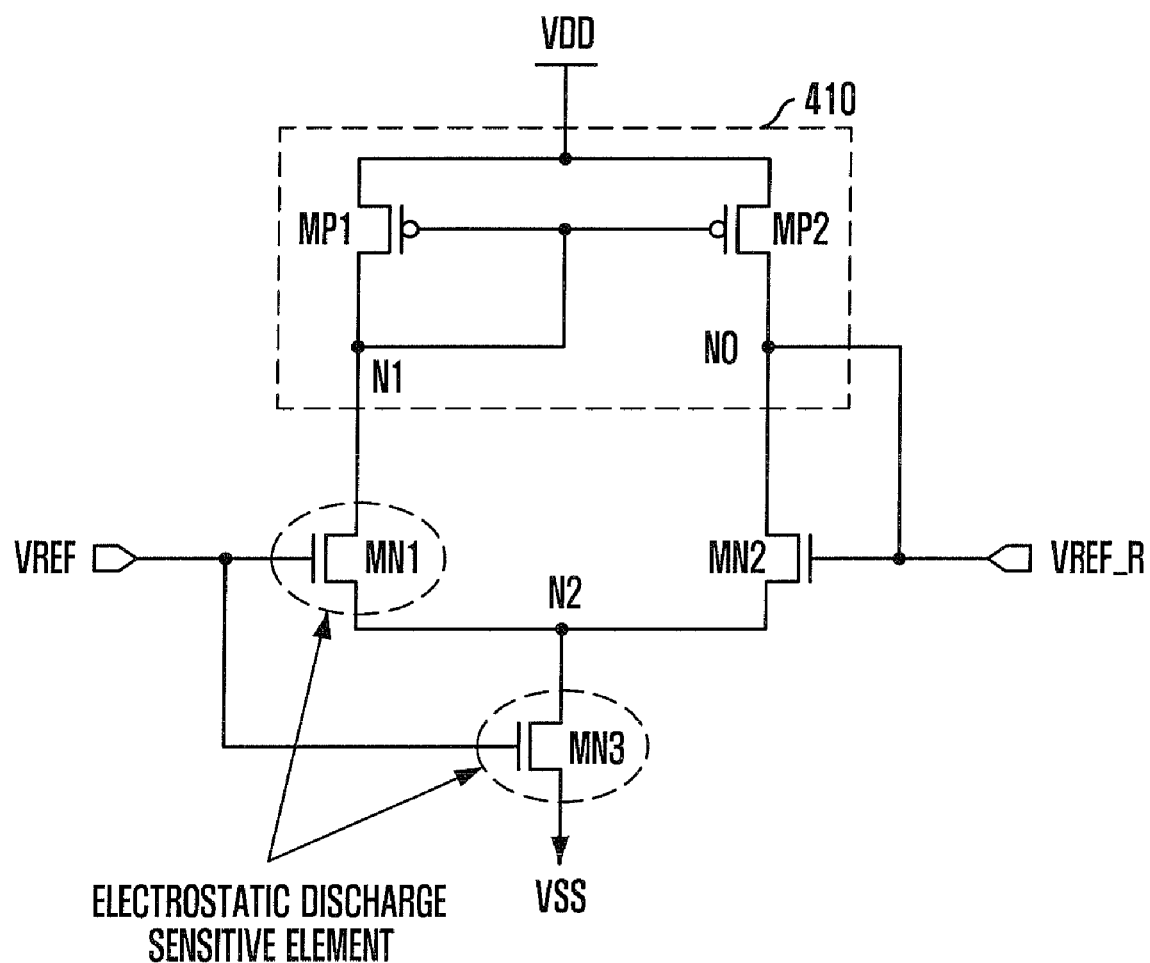
FIG. 4 is a circuit diagram illustrating a unit gain buffer of FIG. 3.

FIG. 4 is a circuit diagram illustrating the unit gain buffer of FIG. 3.

Referring to FIG. 4, the unit gain buffer includes a current mirroring unit 410 connected between a power source voltage end VDD and both a first connection end N1 and an output end N0, a first input transistor MN1 connected between the first connection end N1 and a second connection end N2 and controlled by the reference voltage VREF, a second input transistor MN2 connected between the output end N0 and the second connection end N2 and connected by the internal reference voltage VREF_R outputted from the output end N0, and a bias transistor MN3 connected between the second connection end N2 and a ground voltage end VSS and controlled by the reference voltage VREF.

In the unit gain buffer according to the present embodiment, the first input transistor MN1 is an NMOS transistor that receives the reference voltage VREF as the input of the gate, and the bias transistor MN3 is an NMOS transistor for receiving the reference voltage VREF as the input of the gate. Therefore, both of the first input transistor MN1 and the bias transistor MN3 may be an electrostatic discharge sensitive element, and the external and internal electrostatic discharge protectors protect the first input transistor MN1 and the bias transistor MN3. The unit gain buffer may have a structure different from that of the present embodiment if it is necessary.

Figure 5:
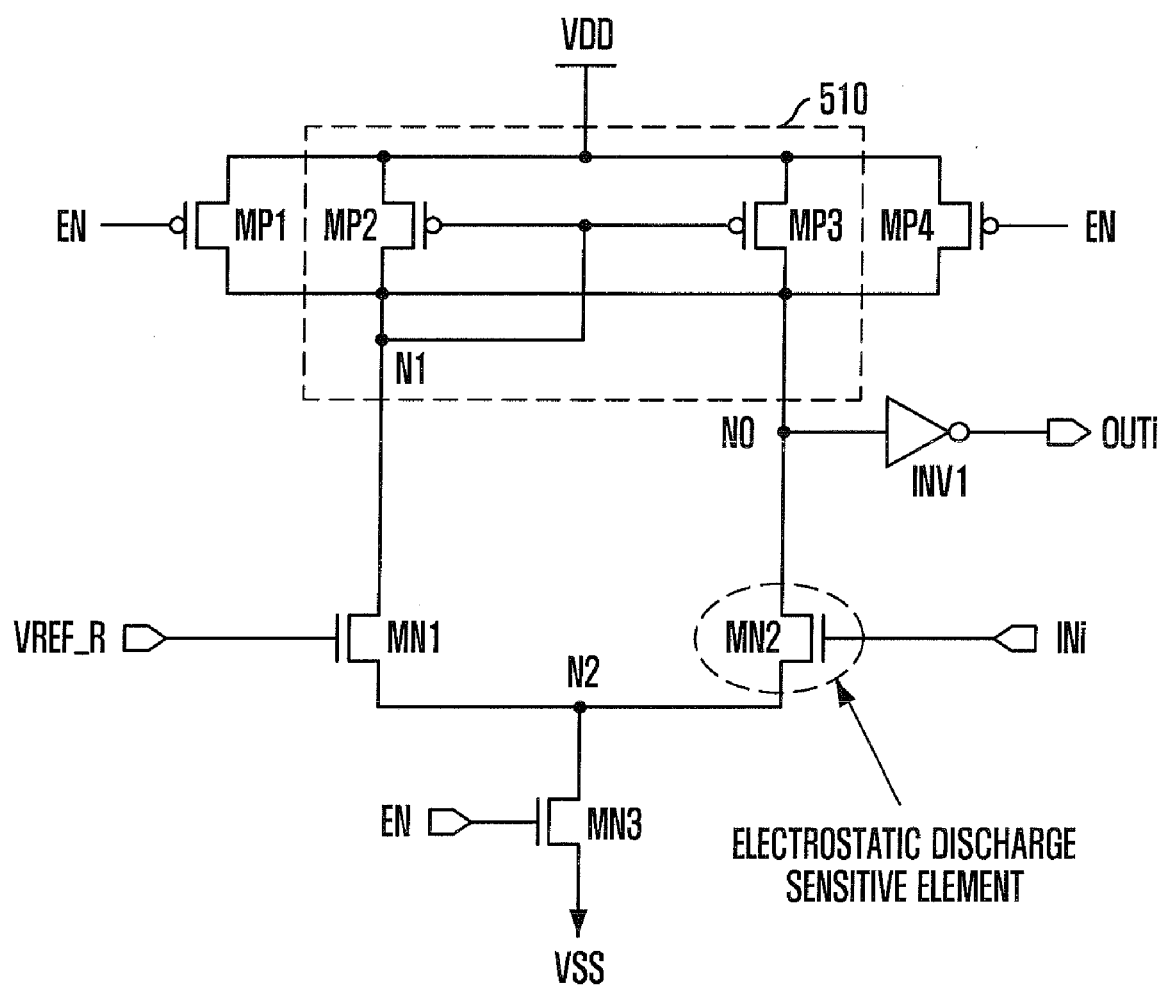
FIG. 5 is a circuit diagram illustrating an input buffer of FIG. 3.

FIG. 5 is a circuit diagram illustrating the input buffer of FIG. 3.

Referring to FIG. 5, the input buffer includes a current mirroring unit 510 connected between a power source voltage end VDD and both a first connection end N1 and an output end N0, a first input transistor MN1 connected between the first connection end N1 and a second connection end N2 and controlled by an internal reference voltage VREF_R, a second input transistor MN2 connected between the output end N0 and the second connection end N2 and controlled by an input signal INi, and a bias transistor MN3 connected between the second connection end N2 and a ground voltage end VSS and controlled by an enable signal EN.

The input buffer further includes an inverter INV1 for inverting a signal outputted from the output end N0, a first transistor MP1 connected between the power source voltage end VDD and the first connection end N1 and controlled by the enable signal EN, and a second transistor MP4 connected between the power source voltage end VDD and the output end N0 and controlled by the enable signal EN. The first and second transistors MP1 and MP4 precharge the first connection end N1 and the output end N0 with high level when the enable signal EN is inactivated to a low level.

In the input buffer, the first input transistor MN1 is an NMOS transistor receiving an internal reference voltage VREF_R as the input of the gate, and the second input transistor MN2 is an NMOS transistor receiving a corresponding input signal INi as the input of the gate. Therefore, the second input transistor MN2 may be an electrostatic discharge sensitive element, and the external and internal electrostatic discharge protectors connected to the transmission path of the input signal INi protect the second input transistor MN2. However, the first input transistor MN1 is not an electrostatic discharge sensitive element because the first input transistor MN1 receives the intern reference voltage VREF_R outputted from the unit gain buffer as the input of the gate. Therefore, it is not necessary to have an internal electrostatic discharge protector for protecting the first input transistor MN1.

Figure 6:
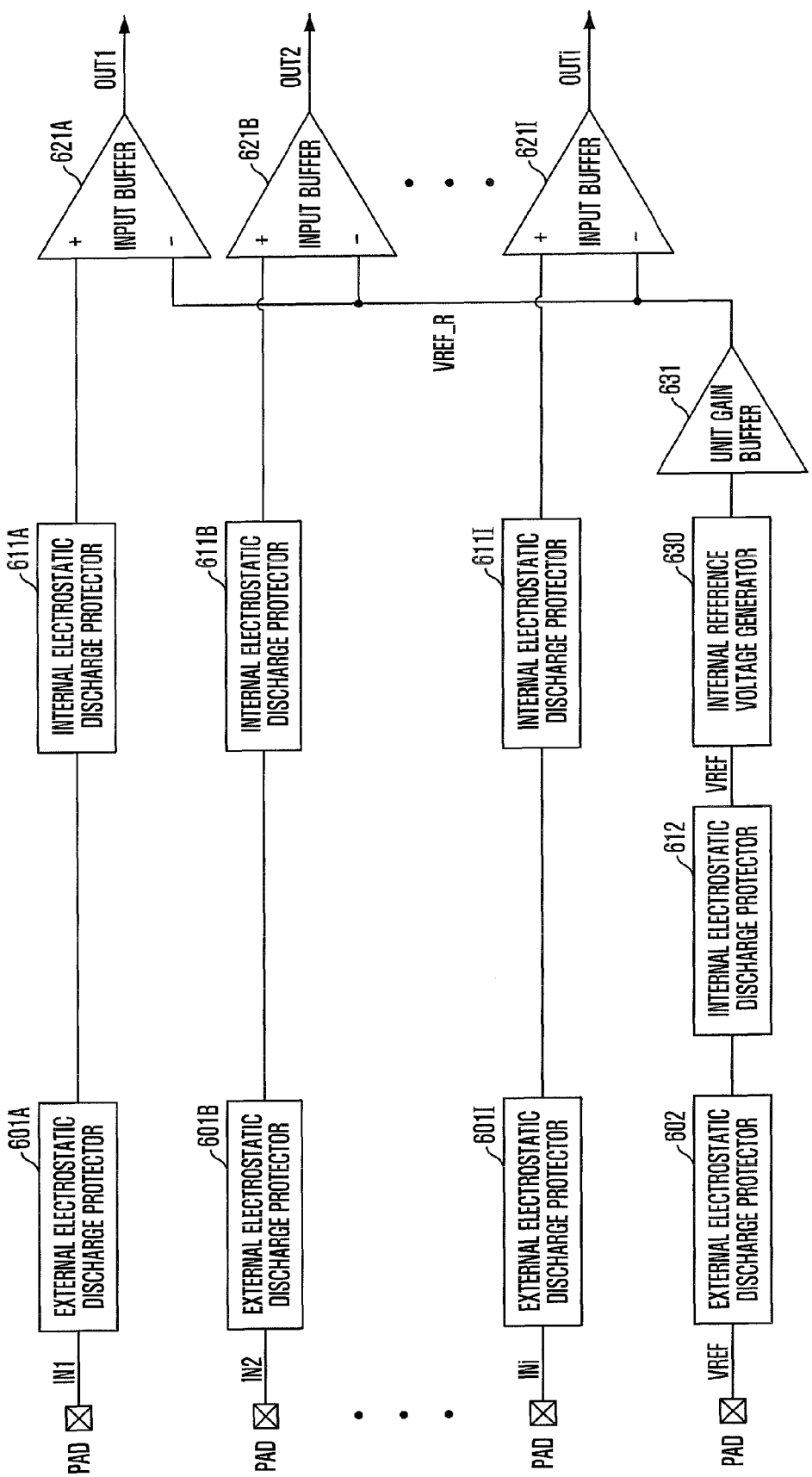
FIG. 6 is a diagram illustrating a semiconductor device in accordance with another embodiment of the present invention.

FIG. 6 is a diagram illustrating a semiconductor device in accordance with another embodiment of the present invention.

Referring to FIG. 6, the semiconductor device according to another embodiment includes a plurality of pads PAD for receiving a reference voltage VREF and a plurality of input signals IN1 to INi from the outside, an internal reference voltage generator 630 for generating an internal reference voltage VREF_R by shifting an electric potential level of the reference voltage VREF, a plurality of input buffers 621A to 621I for identifying a corresponding input signal based on the internal reference voltage VREF_R, a plurality of external electrostatic discharge protectors 601A to 601I and 602 connected at the transmission path of the reference voltage and the transmission paths of the plurality of input signals, and a plurality of internal electrostatic discharge protectors 611A to 611I and 612 connected at the transmission path of the reference voltage and the transmission paths of the plurality of input signals. The semiconductor device according to another embodiment may further include a unit gain buffer 631 for transferring the internal reference voltage VREF_R outputted from the internal reference voltage generator 630 to an internal circuit.

The external electrostatic discharge protectors 601A to 601I and 602 are disposed close to the pads because the external electrostatic discharge protectors are electrostatic discharge protection circuits corresponding to the HBM and the MM. Also, the internal electrostatic discharge protectors 611A to 611I and 612 are disposed close to the internal reference voltage generator 630 and the input buffers 621A and 621I because the internal electrostatic discharge protectors are electrostatic discharge protection circuits corresponding to the CDM. Therefore, one external and one internal electrostatic discharge protectors are disposed at the transmission path of each input signal. Also, one external and one internal electrostatic discharge protectors are disposed at the transmission path of the reference voltage VREF.

The internal reference voltage generator 630 generates the internal reference voltage VREF_R by shifting an electric potential level of the reference voltage VREF applied from the outside and applies the generated internal reference voltage VREF_R to each of the input buffers 621A to 621I. The semiconductor device may further include the unit gain buffer 631 for applying a stable internal reference voltage VREF_R if the semiconductor device includes a large number of internal circuits requiring the internal reference voltage VREF_R, such as input buffers. The unit gain buffer 631 may be embodied in various structures as well as a typical structure shown in FIG. 4. Particularly, an internal reference voltage may be used as a signal for controlling a bias transistor of the unit gain buffer. Also, other signals such as a bias signal may be used for controlling the bias transistor of the unit gain buffer.

Figure 7:
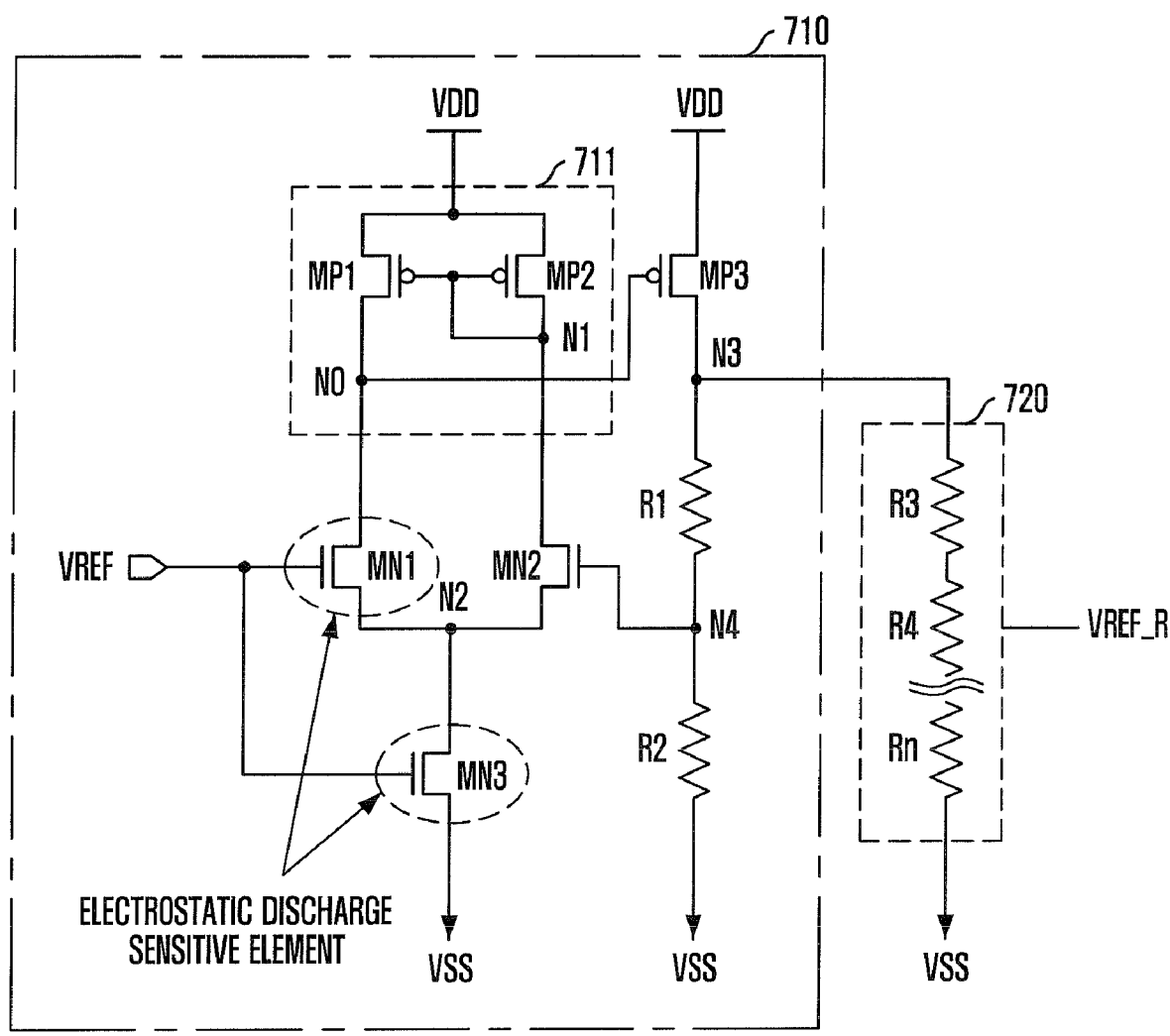
FIG. 7 is a circuit diagram illustrating an internal reference voltage generator 630 of FIG. 6.

FIG. 7 is a circuit diagram illustrating the internal reference voltage generator 630 of FIG. 6.

Referring to FIG. 7, the internal reference voltage generator 630 includes a level shifter 710 for shifting an electric potential level of the reference voltage VREF, and a voltage distributor 720 for outputting the internal reference voltage VREF_R by distributing a voltage of a signal outputted from the level shifter 710.

The level shifter 710 includes a current mirroring unit 711 connected between a power source voltage end VDD and both an output end N0 and a first connection end N1, a first input transistor MN1 connected between the output end N0 and a second connection end N2 and controlled by the reference voltage VREF, a bias transistor MN3 connected between the second connection end N2 and a ground voltage end VSS and controlled by the reference voltage VREF, a first transistor MP3 connected between the power source voltage end VDD and a second output end N3 and controlled by a signal outputted from the first output end N0, a first load R1 connected between the second output end N3 and a third connection end N4, a second load R2 connected between the third connection end N4 and the ground voltage end VSS, and a second input transistor MN2 connected between the first connection end N1 and the second connection end N2 and controlled by a signal outputted from the third connection end N4.

The voltage distributor 720 includes a plurality of loads R3 to Rn connected between the second output end N3 and the ground voltage end VSS.

The internal reference voltage generator 630 outputs the internal reference voltage VREF_R distributed by the plurality of loads R3 to RN at the voltage distributor 720 after the level shifter 710 shifts the electric potential level of the reference voltage VREF. Although the voltage distributor 720 outputs a distributed voltage according to a resistance value by simply connecting a plurality of loads R3 to RN in series in the present embodiment, the voltage distributor 720 may include a switch to selectively output various distributed voltages. In the internal reference voltage generator 630, the first input transistor MN1 of the level shifter 710 is an NMOS transistor for receiving the reference voltage VREF as the input the a gate, and the bias transistor MN3 is also an NMOS transistor receiving the reference voltage VREF as the input of the gate. Therefore, both bias transistor MN3 and first input transistor MN1 may be electrostatic discharge sensitive elements, and the external and internal electrostatic discharge protectors protect the first input transistor MN1 and the bias transistor MN3.

Meanwhile, an internal reference voltage input end of an internal circuit that receives the internal reference voltage VREF_R from the level shifter 710, such as an input buffer, does not include electrostatic discharge sensitive elements. Therefore, it is not necessary to include an internal electrostatic discharge protector. As the input buffer, it is used an input buffer that identifies a corresponding input buffer based on an internal reference voltage as shown in FIG. 5.

Embodiments of the present invention relate to a technology for forming an electrostatic discharge protection circuit of a semiconductor device. Since it is possible to reduce the number of the electrostatic discharge sensitive elements included in each of input buffers according to the present invention, it is also possible to reduce the number of internal electrostatic discharge protectors. Therefore, an area for the electrostatic discharge protectors in the semiconductor device can be reduced. Also, parasitic capacitance and current leakage problems at the reference voltage transmission path and defect problem can be improved.

While the present invention has been described with respect to the specific embodiments, it will be apparent to those skilled in the art that various changes and modifications may be made without departing from the spirit and scope of the invention as defined in the following claims.

For example, configuration of active high and active low for expressing signal activation may differ according to embodiments. Also, a structure of a transistor may be changed to embody the same function according to the demand. That is, the structure of a PMOS transistor may be replaced with that of an NMOS transistor and vice versa. Also, configuration of the PMOS transistor and the NMOS transistor may be embodied using various transistors. Furthermore, the unit gain buffer, the internal reference voltage generator, and the input buffer may be designed or controlled in various forms. Since various modifications can be made and it is obvious to those skilled in the art, the detail description thereof is omitted.

What is claimed is:

1. A semiconductor device, comprising:
    a plurality of pads for receiving a reference voltage and a plurality of input signals from an external device;
    a unit gain buffer for receiving the reference voltage as an input;
    a plurality of input buffers, each identifying a corresponding one of the plurality of input signals based on an internal reference voltage outputted from the unit gain buffer;
    a plurality of external electrostatic discharge protectors connected to a transmission path of the reference voltage and transmission paths of the plurality of input signals; and
    a plurality of internal electrostatic discharge protectors connected to the transmission path of the reference voltage and the transmission paths of the plurality of input signals.

2. The semiconductor device of claim 1, wherein the plurality of internal electrostatic discharge protectors are disposed closer to the unit gain buffer and the plurality of input buffers than are the plurality of external electrostatic discharge protectors.

3. The semiconductor device of claim 1, wherein the unit gain buffer includes:
    a current mirroring unit connected between a power source voltage end and both a first connection end and an output end;
    a first input transistor connected between the first connection end and a second connection, and controlled by the reference voltage;
    a second input transistor connected between the output end and the second connection end, and controlled by the internal reference voltage outputted from the output end; and
    a bias transistor connected between the second connection end and a ground voltage end, and controlled by the reference voltage.

4. The semiconductor device of claim 1, wherein each of the plurality of input buffers includes:
    a current mirroring unit connected between a power source voltage end and both a first connection end and an output end;
    a first input transistor connected between the first connection end and a second connection end, and controlled by the internal reference voltage;
    a second input transistor connected between the output end and the second connection end and, controlled by a corresponding one of the plurality of input signals; and
    a bias transistor connected between the second connection end and a ground voltage end, and controlled by an enable signal.

5. The semiconductor device of claim 4, wherein each of the plurality of input buffers further includes:
    an inverter for inverting a signal outputted from the output end;
    a first transistor connected between the power source voltage end and the first connection end, and controlled by the enable signal; and a second transistor connected between the power source voltage and the output end, and controlled by the enable signal.

6. A semiconductor device, comprising:
   a plurality of pads for receiving a reference voltage and a plurality of input signals from an external device;
   an internal reference voltage generator for generating an internal reference voltage by shifting an electric potential level of the reference voltage;
   a plurality of input buffers, each for identifying a corresponding one of the plurality of input signals based on the internal reference voltage;
   a plurality of external electrostatic discharge protectors connected to a transmission path of the reference voltage and transmission paths of the plurality of input signals; and
   a plurality of internal electrostatic discharge protectors connected to a transmission path of the reference voltage and transmission paths of the plurality of input signals.

7. The semiconductor device of claim 6, further comprising a unit gain buffer for transferring the internal reference voltage outputted from the internal reference voltage generator to an internal circuit.

8. The semiconductor device of claim 7, wherein the unit gain buffer includes:
   a current mirroring unit connected between a power source voltage end and both a first connection end and an output end;
   a first input transistor connected between the first connection end and a second connection end, and controlled by the internal reference voltage;
   a second input transistor connected between the output end and the second connection end, and controlled by a signal outputted from the output end; and
   a bias transistor connected between the second connection end and a ground voltage end, and controlled by a bias signal.

9. The semiconductor device of claim 6, wherein the plurality of internal electrostatic discharge protectors are disposed closer to the internal reference voltage generator and the plurality of input buffers than are the plurality of external electrostatic discharge protectors.

10. The semiconductor device of claim 6, wherein the internal reference voltage generator includes:
    a level shifter for shifting an electric potential level of the reference voltage; and
       a voltage distributor for outputting the internal reference voltage by distributing a voltage of a signal outputted from the level shifter.

11. The semiconductor device of claim 10, wherein the level shifter includes:
    a current mirroring unit connected between a power source voltage end and both a first output end and a first connection end;
    a first input transistor connected between the first output end and a second connection end, and controlled by the reference voltage;
    a bias transistor connected between the second connection end and a ground voltage end, and controlled by the reference voltage;
    a first transistor connected between the power source voltage end and a second output end, and controlled by a signal outputted from the first output end;
    a first load connected between the second output end and a third connection end;
    a second load connected between the third connection end and the ground voltage end; and
    a second input transistor connected between the first connection end and the second connection end, and controlled by a signal outputted from the third connection end.

12. The semiconductor device of claim 11, wherein the voltage distributor includes a plurality of loads connected between the second output end and the ground voltage end.

13. The semiconductor device of claim 6, wherein each of the plurality of input buffers includes:
    a current mirroring unit connected between a power source voltage end and both a first connection end and an output end;
    a first input transistor connected between the first connection end and a second connection end, and controlled by the internal reference voltage;
    a second input transistor connected between the output end and the second connection end, and controlled by a corresponding one of the plurality of input signals; and
    a bias transistor connected between the second connection end and a ground voltage end, and controlled by an enable signal.

14. The semiconductor device of claim 13, wherein each of the plurality of input buffers further includes:
    an inverter for inverting a signal outputted from the output end;
    a first transistor connected between the power source voltage end and the first connection end, and controlled by the enable signal; and
    a second transistor connected between the power source voltage and the output end, and controlled by the enable signal.

* * * * *